(12) United States Patent
Wang et al.

(10) Patent No.: US 8,621,160 B2
(45) Date of Patent: Dec. 31, 2013

(54) SYSTEM AND METHOD FOR CONTENTION-FREE MEMORY ACCESS

(75) Inventors: Guohui Wang, Houston, TX (US); Yang Sun, San Diego, CA (US); Joseph R. Cavallaro, Pearland, TX (US); Yuanbin Guo, Allen, TX (US)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 13/329,065

(22) Filed: Dec. 16, 2011

(65) Prior Publication Data

US 2012/0166742 A1 Jun. 28, 2012

Related U.S. Application Data

(60) Provisional application No. 61/424,392, filed on Dec. 17, 2010.

(51) Int. Cl.
*G06F 12/06* (2006.01)
*G06F 13/376* (2006.01)

(52) U.S. Cl.
USPC .................... 711/150; 711/149; 711/E12.079

(58) Field of Classification Search
USPC .................................. 711/149, 150, E12.079
See application file for complete search history.

(56) References Cited

U.S. PATENT DOCUMENTS

| | | | | |
|---|---|---|---|---|
| 7,783,936 | B1 * | 8/2010 | Hall et al. | 714/701 |
| 7,814,283 | B1 * | 10/2010 | Chen et al. | 711/151 |
| 2005/0041637 | A1 * | 2/2005 | Bialkowski et al. | 370/351 |
| 2005/0190736 | A1 * | 9/2005 | Zory et al. | 370/342 |
| 2006/0083174 | A1 * | 4/2006 | Shim et al. | 370/245 |
| 2008/0091986 | A1 | 4/2008 | Nimbalker et al. | |
| 2008/0104478 | A1 | 5/2008 | Oz et al. | |
| 2008/0205636 | A1 | 8/2008 | Nimbalker et al. | |
| 2009/0199066 | A1 | 8/2009 | Kim et al. | |
| 2010/0077265 | A1 | 3/2010 | Wei et al. | |

FOREIGN PATENT DOCUMENTS

| | | |
|---|---|---|
| EP | 1401108 A1 | 9/2003 |
| EP | 1555760 A1 | 1/2004 |

OTHER PUBLICATIONS

International Search Report received in Patent Cooperation Treaty Application No. PCT/CN2011/084220, mailed Mar. 22, 2012, 3 pages.
Written Opinion of the International Searching Authority received in Patent Cooperation Treaty Application No. PCT/CN2011/084220, mailed Mar. 22, 2012, 4 pages.

(Continued)

*Primary Examiner* — Hal Schnee
(74) *Attorney, Agent, or Firm* — Conley Rose, P.C.; Grant Rodolph; Rayhao Chung

(57) ABSTRACT

A memory control unit of a turbo code decoder includes a buffer having a plurality of storage slots, a buffer control operatively coupled to the buffer, a router operatively coupled to the buffer control and to a plurality of data sources, and a conflict detection unit operatively coupled to the router, to the buffer control, and to the plurality of data sources. The buffer temporarily stores information intended for storage in a memory bank. The buffer control determines a number of available storage slots in the buffer. The router routes data from the data sources to the buffer control. The conflict detection unit initiates a temporary halt of some of the data sources when the number of available storage slots is insufficient to store all of the data from data sources attempting to access the memory bank.

22 Claims, 10 Drawing Sheets

(56) References Cited

OTHER PUBLICATIONS

Thul, M. J., et al., "*Enabling High-Speed Turbo-Decoding Through Concurrent Interleaving*", IEEE ISCAS (2002), vol. 1; (pp. I-897-I-900).

Thul, M.J., et al., "*Optimized Concurrent Interleaving Interleaving Architecture for High-Throughput Turbo-Decoding*", IEEE International Conference on Electronics, Circuits and Systems (2002); pp. 1099-1102.

Speziali, F., et al., "*Scalable and area efficient concurrent interleaver for High Throughput Turbo-Decoders*", Euromicro Symposium on Digital System Design (2004); pp. 1-8.

Asghar, R., et al., "*Memory Conflict Analysis and Interleaver Design for Parallel Turbo Decoding Supporting HSPA Evolution*", IEEE 12 Euromicro Conference on Euromicro Symposium on Digital System Design; (2004); pp. 699-706.

Asghar, R., et al., "*Towards Radix-4, Parallel Interleaver Design to Support High-Throughput Turbo Decoding for Re-Configurability*", IEEE Sarnoff Symposium, (2000); pp. 1-5.

* cited by examiner

SYSTEM AND METHOD FOR CONTENTION-FREE MEMORY ACCESS

This application claims the benefit of U.S. Provisional Application No. 61/424,392, filed on Dec. 17, 2010, entitled "System and Method for Contention-Free Memory Access in an Interleaver", which application is hereby incorporated herein by reference.

TECHNICAL FIELD

The present invention relates generally to signal processing, and more particularly to a system and method for a contention-free memory access.

BACKGROUND

Turbo codes are a class of forward error correction (FEC) codes that closely approach the channel capacity (a theoretical maximum for a code rate of a communications channel at which reliable communications is possible given a specific noise level) of a communications channel. Turbo decoders are decoders of turbo codes. Generally, a turbo decoder comprises two component Soft-in Soft-out (SISO) decoders. The SISO decoder may implement a Maximum A posteriori Probability (MAP) algorithm or a soft-output Viterbi algorithm (SOVA) to decode encoded signals.

Algorithms implemented in SISO decoders, such as MAP algorithms, SOVA, and the like, tend to be computationally intensive; therefore, many techniques have been devised to improve decoding performance. One commonly used technique for improving decoding performance is to use parallel SISO decoding, wherein multiple SISO decoders are used and data parallelism is exploited to improve decoding performance.

SUMMARY OF THE INVENTION

Example embodiments of the present invention which provide a system and method for a contention-free memory access.

In accordance with an example embodiment of the present invention, a memory control unit of a turbo code decoder is provided. The memory control unit includes a buffer having a plurality of storage slots, a buffer control operatively coupled to the buffer, a router operatively coupled to the buffer control and to a plurality of data sources, and a conflict detection unit operatively coupled to the router, to the buffer control, and to the plurality of data sources. The buffer temporarily stores information intended for storage in a memory block. The buffer control determines a number of available storage slots in the buffer. The router routes data from the data sources to the buffer control. The conflict detection unit initiates a temporary halt of some of the data sources when the number of available storage slots is insufficient to store all of the data from data sources attempting to access the memory block.

In accordance with another example embodiment of the present invention, an information decoder is provided. The information decoder includes decoders, an address generator, memory banks, and memory control units with each memory control unit operatively coupled to the decoders, to one of the memory banks, and to the address generator. The decoders collectively decode a signal according to a decoding algorithm, and generate data therefrom. The address generator generates memory addresses for data generated by the decoders. The memory banks store the data generated by the decoders according to the memory addresses generated by the address generator. Each of the memory control units temporarily stores information intended for storage in the one of the memory banks, and each of the memory control units determines a number of available storage slots, routes data from the decoders to the storage slots, and temporarily stalls operation of some of the decoders when the number of available storage slots is insufficient to store all of the data from the decoders attempting to access the one of the memory banks.

In accordance with another example embodiment of the present invention, a method for operating a memory control unit is provided. The method includes receiving, from a data source, data associated with an integer number N concurrent memory accesses to a memory bank, and determining an integer number M of available storage slots in a buffer. The method also includes temporarily storing the data associated with the N concurrent memory accesses to the buffer if M is greater than or equal to N, and temporarily storing the data associated with M of the N concurrent memory accesses to the buffer if N is greater than M. The method further includes halting N−M of the N concurrent memory access if N is greater than M.

One advantage of an embodiment is that contention-free memory access is provided for parallel SISO decoders, which may improve turbo decoder performance.

A further advantage of an embodiment is that hardware and software complexity is not significantly increased, which may negatively impact deployment of the embodiment.

Yet another advantage of an embodiment is that a wide range of parallel SISO decoder architectures and associated algorithms are supported.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The operating of the current example embodiments and the structure thereof are discussed in detail below. It should be appreciated, however, that the present invention provides many applicable inventive concepts that can be embodied in a wide variety of specific contexts. The specific embodiments discussed are merely illustrative of specific structures of the invention and ways to operate the invention, and do not limit the scope of the invention.

One embodiment of the invention relates to preventing contention in memory accesses. For example, a first buffer is used to buffer memory writes to a memory bank so that the memory writes can proceed at a normal pace without having to stall (or halt) sources of the memory writes. A second buffer is used to store a specified number simultaneous memory writes, thereby always permitting the specified number of simultaneous memory writes to proceed.

The present invention will be described with respect to preferred embodiments in a specific context, namely a communications device implementing parallel MAP decoders in a turbo decoder. The invention may be applied to communications devices implementing different types of parallel SISO decoders and associated algorithms, of which MAP algorithms and SOVA are examples. The invention may be applied to communications devices operating in a wide range of communications networks, such as UMTS, 3GPP LTE, WiMAX, and the like, technical standards compliant communications networks. Furthermore, the invention may be applied to communications devices capable of operating in a multi-mode (such as those that may simultaneously operate in two or more communications networks).

Figure 1:
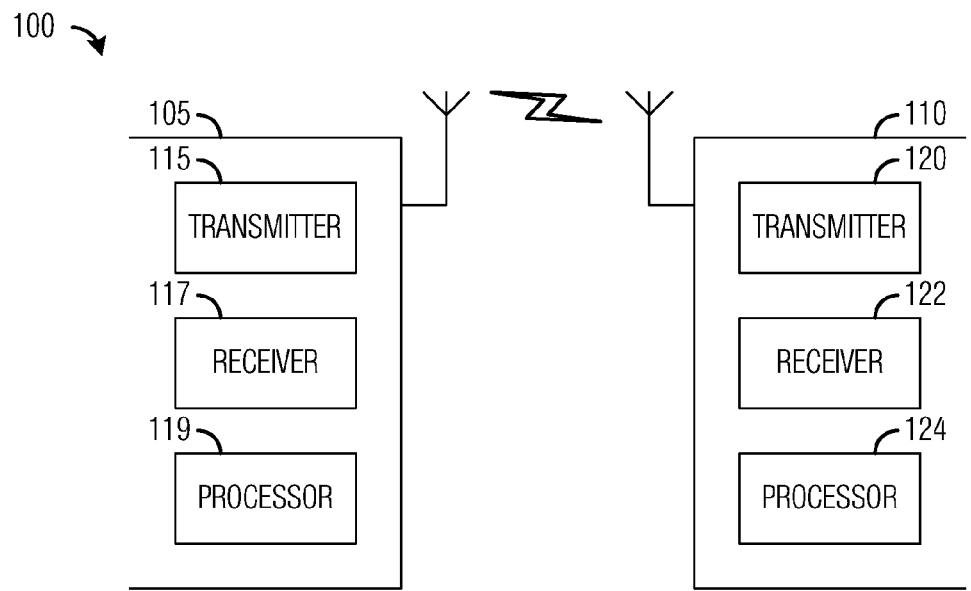
FIG. 1 illustrates an example diagram of a communications system according to example embodiments described herein.

FIG. 1 illustrates a communications system 100. Communications system 100 includes a first communications device 105 and a second communications device 110. First communications device 105 and second communications device 110 may communicate by transmitting information over-the-air. First communications device 105 and second communications device 110 each includes a transmitter (transmitter 115 and transmitter 120) and a receiver (receiver 117 and receiver 122). Transmissions from first communications device 105 by transmitter 115 may be received at second communications device 110 by receiver 122. Similarly, transmissions from second communications device 110 by transmitter 120 may be received at first communications device 105 by receiver 117. Transmitters 115 and 120 may encode information using a turbo code and receivers 117 and 122 may decode information using a turbo decoder.

First communications device 105 and second communications device 110 may also include a processor (processor 119 and processor 124) to process information prior to transmission or after reception. The processors may also be used to control the operation of the communications devices, as well as execute applications and/or a user interface.

As discussed previously, the use of turbo codes and SISO decoders to decode them have yielded near channel capacity performance. In particular, the use of parallel SISO decoders helps to improve decoding performance.

However, the use of parallel SISO decoders may lead to memory conflicts, wherein more than one SISO decoder (e.g., an instance of an algorithm, such as a MAP algorithm, a SOVA, and the like) attempts to read or write to a single memory bank. When there is a memory conflict, access to the memory bank may need to be serialized to help ensure memory consistency. Serializing memory access may defeat performance increases arising from the use of parallel SISO decoders and significantly reduces throughput. Furthermore, a percentage of memory conflicts become higher as parallelism increases. Therefore, memory conflicts have become a performance bottleneck for parallel SISO decoding in turbo decoder applications, such as in UMTS, 3GPP LTE, WiMAX and other standards compliant communications devices.

Although the discussion of the example embodiments presented below focuses on MAP algorithms and MAP decoders, which are examples of SISO decoders and associated algorithms, the example embodiments are operable with a wide range of different SISO decoders. Therefore, the discussion of MAP algorithms and MAP decoders should not be construed as being limiting to either the scope or the spirit of the example embodiments.

Figure 2:
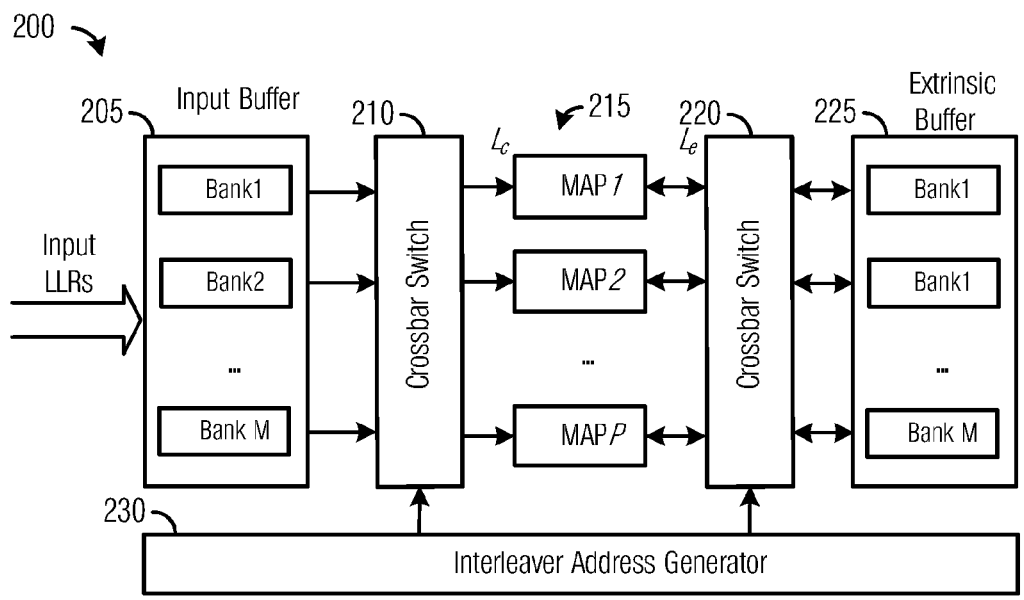
FIG. 2 illustrates an example diagram of a detailed view of a portion of a turbo decoder according to example embodiments described herein.

FIG. 2 illustrates a detailed view of a portion of a turbo decoder 200. Turbo decoder 200 may be designed to implement P parallel MAP decoders 215, where P is a positive integer number. Turbo decoder 200 includes an input buffer 205 comprising up to M memory banks, where M is a positive integer number. The M memory banks may be used to store input information (such as, log-likelihood ratios (LLRs)). A first switch 210, for example, a crossbar switch, may be used to couple any of the M memory banks of input buffer 205 to any of P MAP decoders 215. Output of P MAP decoders 215 may be coupled to any of M memory banks in an output buffer 225 by a second switch 220, for example, a crossbar switch. Switching performed by first switch 210 and second switch 220 may be controlled and configured by an interleaver address generator 230.

At each time step of a parallel turbo decoding process, every MAP decoder reads new data from the memory (for example, input buffer 205) as well as writes the results back to memory (for example, output buffer 225). Since multiple MAP decoders are running in parallel, multiple memory accesses to the same memory bank at the same time may occur, multi-port memories or multiple memory banks, may be required to achieve high throughput. Since multi-port memories are generally not efficient for hardware implementation, multiple memory banks may be used in their place. Usually, in parallel turbo decoding algorithm, one memory is assigned to each MAP decoder.

Figure 3A:
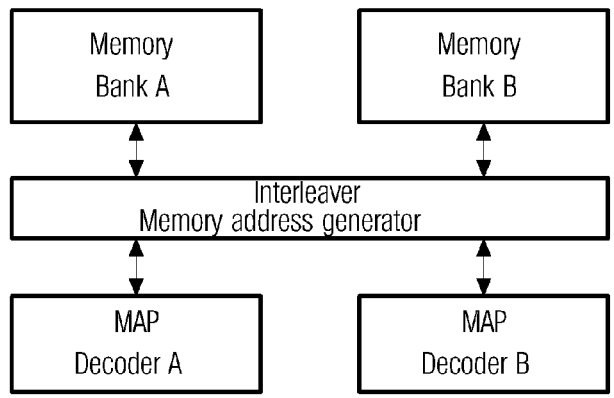
FIG. 3a illustrates an example diagram of a relationship between the two MAP decoders, a data memory and an interleaver according to example embodiments described herein.

An example of a memory conflict is described herein. To simply the discussion of the problem, a smallest block size K=40 is assumed. It is also assumed that two MAP decoders run in parallel (i.e., parallelism P=2), and two separated memory banks are employed (M=2). A full iteration of MAP decoding consists of two half iterations. After a $1^{st}$ half iteration, the data should be interleaved in order that the dependency among the bits in the original data block are changed or removed. FIG. 3a illustrates a relationship between the two MAP decoders, a data memory and an interleaver.

Since the cost of permuting the data inside the memory is high and the latency of reading and writing a block of data in the memory significantly reduces the throughput, moving the data around dynamically is usually not preferred. Instead of actually permuting the data in the memory, it is desirable to keep the data in their original position, and generate interleaved memory access addresses on the fly. These dynamically generated memory access addresses indicate the corresponding addresses in the original data memory for the permuted data. By using these interleaved memory addresses, during a $2^{nd}$ half iteration the MAP decoder knows where to fetch the data it requires, and is able to get the interleaved data from the original memory correctly.

Figure 3B:
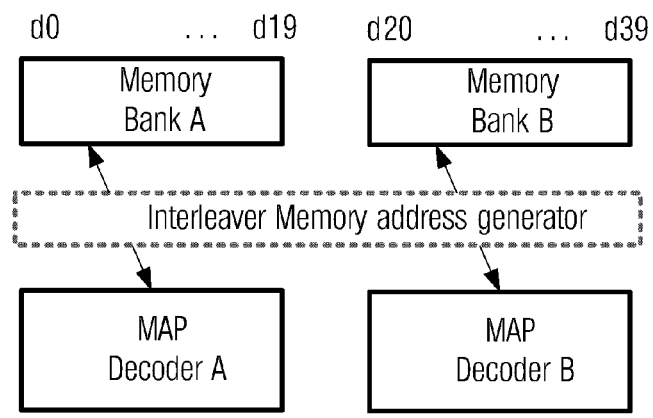
FIG. 3b illustrates an example diagram of a memory access in a first half iteration according to example embodiments described herein.

With the assumption of K=40, the $1^{st}$ half block [d0, d2, ..., d19] is stored in memory bank A, and the $2^{nd}$ half block [d20, d2, ..., d39] is stored in memory bank B. As depicted in FIG. 3b, in the $1^{st}$ half iteration MAP decoder A reads and writes data from memory bank A, while MAP decoder B reads and writes data from memory B. Therefore, there is not any memory conflict in the $1^{st}$ half iteration.

Figure 3C:
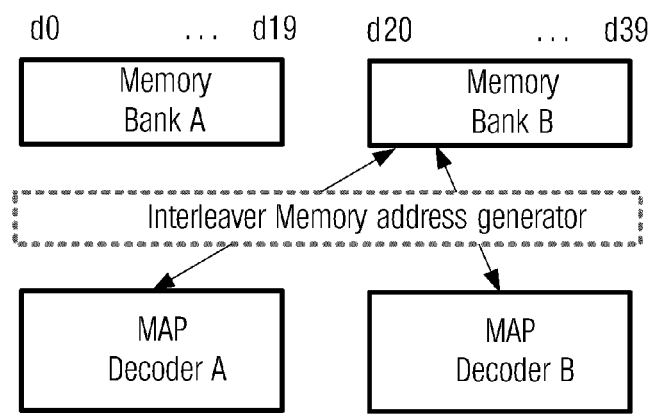
FIG. 3c illustrates an example diagram of a memory access in a second half iteration that leads to a memory access conflict according to example embodiments described herein.

In the $2^{nd}$ half iteration, the data should be read from the memory in an interleaved way. Since the interleaving algorithm is almost random, as shown in FIG. 3c, it is very likely that two MAP decoders attempt to access the same memory bank. The concurrent memory access as shown in FIG. 3c results in a memory conflict event.

In this example, the parallelism of the decoder is only 2, when the parallelism increases further, such as 4, 8, 16 and the like; there could be more than two MAP decoders which try to access the same memory bank at the same time. The memory conflicts may then become a bottleneck for system performance.

Figure 4:
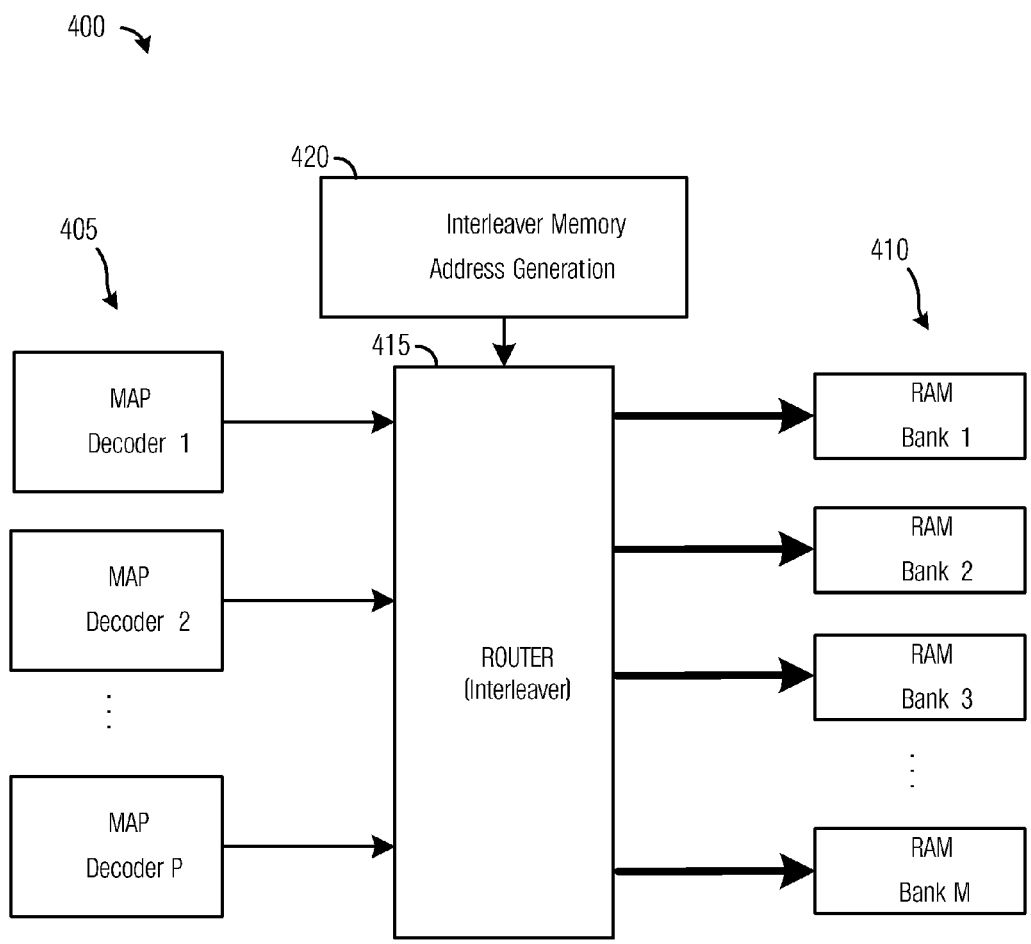
FIG. 4 illustrates an example diagram of a turbo decoder according to example embodiments described herein.

FIG. 4 illustrates an example turbo decoder 400. Turbo decoder 400 includes a plurality of MAP decoders 405 (FIG. 4 shows an integer number P MAP decoders) coupled to a memory 410 that may be partitioned into M memory banks. Coupling plurality of MAP decoders 405 to memory 410 is a router 415. For example, router 415 may be configured by an interleaver memory address generation unit 420 that generates addresses that specifies connections between the plurality of MAP decoders 405 to the memory banks in memory 410. Router 415 may also be referred to as an interleaver or a switch.

Figure 5A:
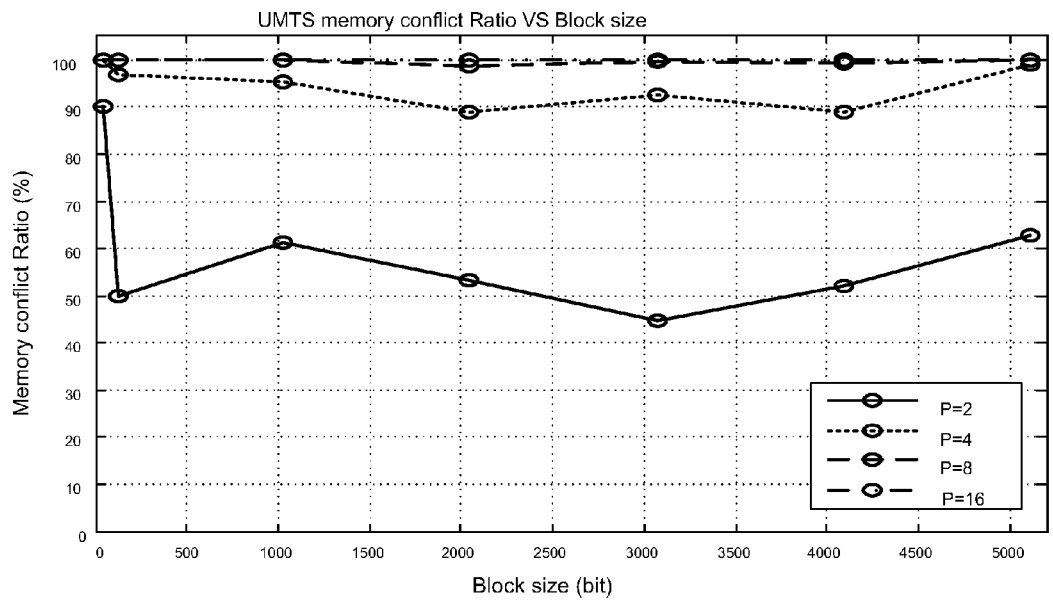
FIG. 5a illustrates an example plot of memory conflict ratio versus block size for different degrees of MAP decoder parallelism according to example embodiments described herein.

FIG. 5a illustrates a plot of memory conflict ratio versus block size for different degrees of MAP decoder parallelism. When MAP decoder parallelism is low (P=2), the memory conflict ratio remains at about 50%, however, when parallelism increases (P greater than or equal to 4) the memory conflict ratio increases to above 90%. Clearly, for high parallelism, memory conflicts become a serious bottleneck in turbo decoder and overall system performance.

Figure 5B:
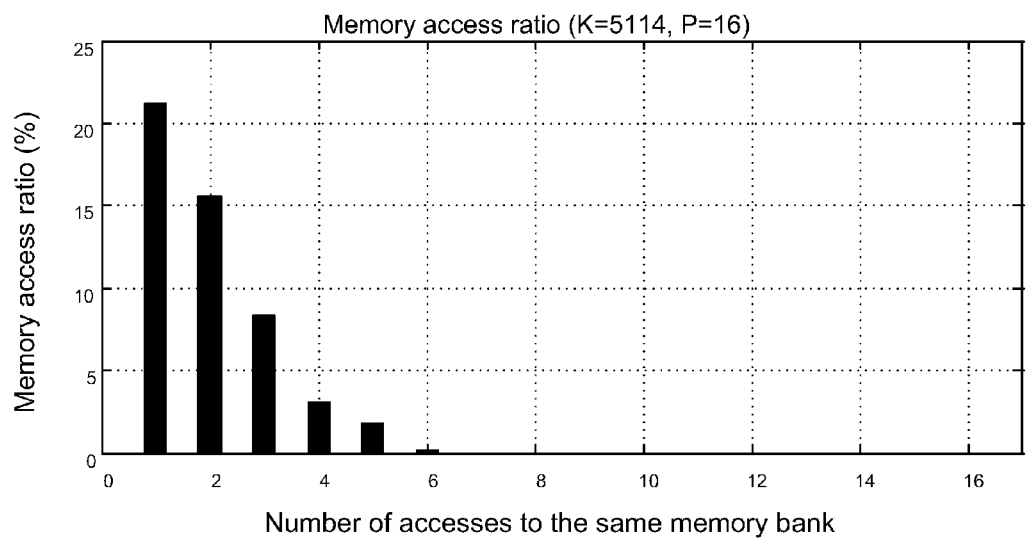
FIG. 5b illustrates an example plot of memory access ratio versus number of memory accesses to a single memory bank according to example embodiments described herein.

FIG. 5b illustrates a plot of memory access ratio versus number of memory accesses to a single memory bank. As shown in FIG. 5b, a majority of memory conflicts are due to two or three memory accesses to a single memory bank. Therefore, consideration of a solution that handles memory access conflicts arising from four or more memory accesses to the single memory bank may not be cost-effective.

Table 1 illustrates a relationship between memory conflict ration and number of memory banks. As shown in Table 1, the memory conflict ratio could be reduced by partitioning the memory into more banks. However, just increasing the number of memory banks could only reduce the memory conflict by a limited ratio. Moreover, using more memory banks increases the hardware cost. Therefore, only adding more memory banks does not solve memory conflict problem, and it should be used when combining with the contention-free interleaver architecture.

TABLE 1

Memory conflict ratio versus Number of memory banks.

| Number of Memory Banks | 16 | 32 | 64 | 128 |
|---|---|---|---|---|
| Memory Conflict Ratio | 100% | 100% | 97% | 76.88% |

According to an example embodiment, a goal may be to reduce and/or hide memory conflicts in order to make the latency of router 415 as small as possible, otherwise a router (such as router 415) becomes a bottleneck of a turbo decoder and degrades the performance of the turbo decoder as well as the overall performance of the communications system. It is therefore desirable to use small buffers to store (temporarily) data when memory conflicts occur and to smooth out the memory access flows among different memory banks over time.

Figure 6:
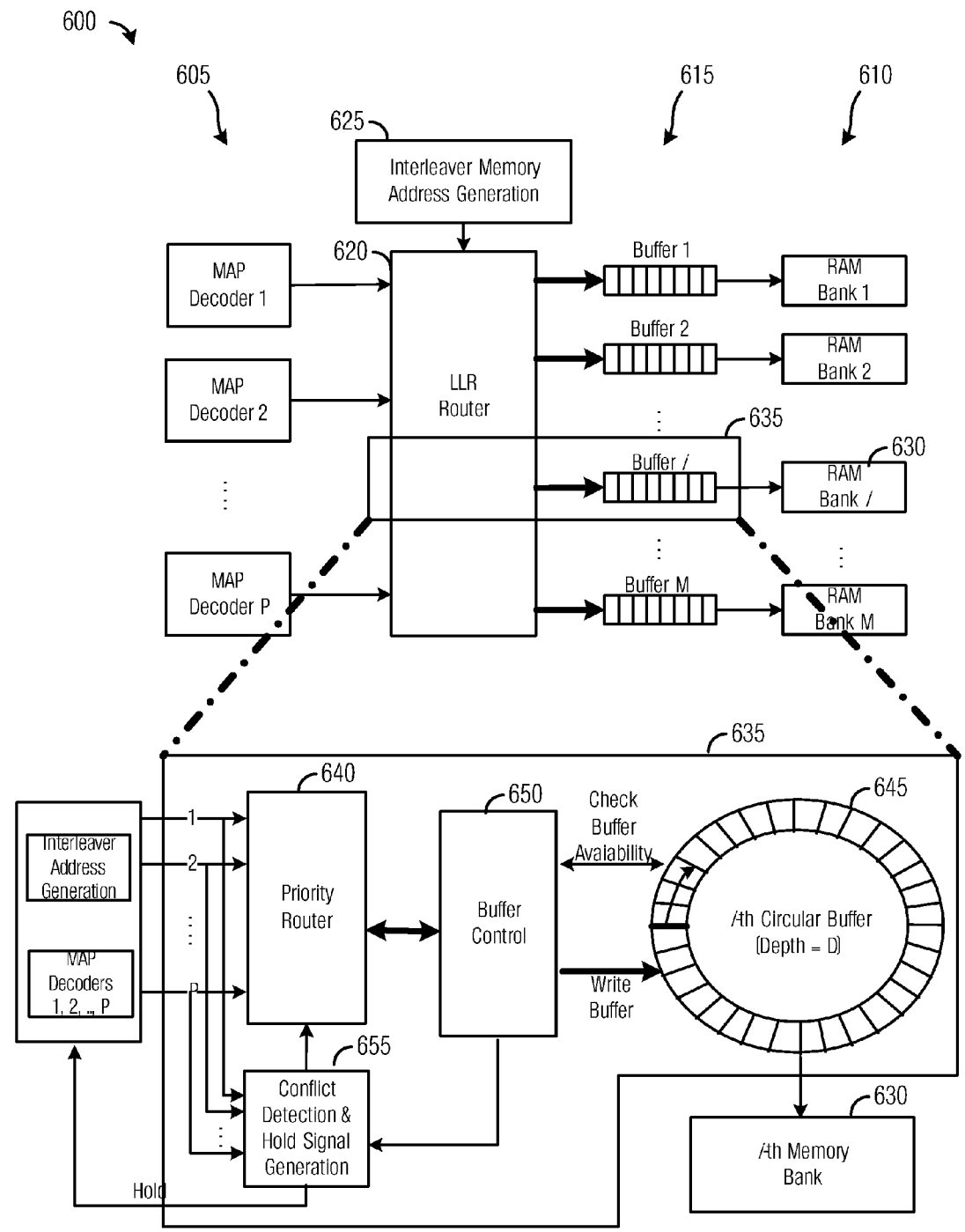
FIG. 6 illustrates an example diagram of a turbo decoder with a contention-free interleaver according to example embodiments described herein.

FIG. 6 illustrates an example turbo decoder 600 with a contention-free interleaver. For example, turbo decoder 600 includes a plurality of MAP decoders 605 (e.g., P MAP decoders), and a memory 610 that is partitioned in to M memory banks. Furthermore, for example, each of the M memory banks in memory 610 may have a buffer positioned between the memory bank and plurality of MAP decoders 605. Collectively, the buffers may be referred to as buffers 615. As shown in FIG. 6, there are M buffers in buffers 615, one buffer for each of the M memory banks in memory 610. The MAP decoders in plurality of MAP decoders 605 may be coupled to memory banks in memory 610 by router 620, for example, which may be configured by interleaver memory address generation unit 625.

According to an embodiment, each memory bank of memory 610 (for example, memory bank i 630, has a memory bank buffer control unit 635 to help provide contention-free performance. A detailed discussion of a memory bank buffer control unit (e.g., memory bank buffer control unit 635) is provided below. Although the discussion focuses on a single memory bank buffer control unit, each memory bank may have a memory bank buffer control unit and they may all be substantially identical in configuration and operation. Therefore, the discussion of a single memory bank buffer control unit should not be construed as being limiting to either the scope or the spirit of the embodiments.

In an embodiment, memory bank buffer control unit 635 may include a priority router 640 that may be a part of router 620 and may be used to couple a MAP decoder to a buffer 645 and i-th memory bank 630. For example, a buffer control 650 may provide control signals based on a state of buffer 645. For example, buffer control 650 may be able to determine if buffer 645 is empty, partly full, or full (e.g., a state of buffer 645) and generate control signals based on the state of buffer 645. Buffer control 650 may also be used to permit writes to buffer 645.

In an embodiment, conflict detection unit 655 may be used to generate control signals that may be provided to priority router 640 and a MAP decoder(s) coupled to i-th memory bank 630. For example, conflict detection unit 655 may detect simultaneous memory accesses to i-th memory bank 630 and if there are more simultaneous memory accesses to i-th memory bank 630 than allowed or if buffer 645 is full, then conflict detection unit 655 may generate control signals to stall (or hold or halt) one or more MAP decoders coupled to i-th memory bank 630. In another embodiment, further, conflict detection unit 655 may generate a control signal to be provided to priority router 640 under similar circumstances. In general, the terms stall, hold, halt, and the like, may be used interchangeably to describe a temporary stoppage of an operation, such as the operation of a MAP decoder, for example.

In general, buffer 645 is designed to temporarily store the LLR data packets which consist of the LLR data and the destination addresses for the LLR data. In an embodiment, the depth of buffer 645 is generally not very deep, and several data could be written at the same time. Two pointers are used to control buffer writing and reading, respectively. For example, at every time step, buffer 645 writes one LLR data into i-th memory bank 630 if buffer 645 is not empty. If there is no usable slot in buffer 645, buffer control 650 directly notifies conflict detection unit 655 to generate control signals to stall (or hold or halt) for all the MAP decoders that attempt to access i-th memory bank 630.

Conflict detection unit 655 checks the destination address for every LLR data output from MAP decoders. Conflict detection unit 655 first selects the destination addresses which are in the range of i-th memory bank 630, and then it counts the number of the selected addresses. As an example, if the number of selected addresses is greater than two, then a memory conflict will occur. Finally, conflict detection unit 655 will pass the conflict information to priority router 640 or to the MAP decoders, for example, in the form of the control signal.

As discussed previously, most frequent memory conflicts are caused by 2 or 3 MAP decoders that attempt to access a single memory bank. Although in a worst case scenario, there might be more than 3 MAP decoder accessing a single memory bank at the same time, those cases are normally rare so that on average they will not significantly impact the system performance. In an embodiment, in turbo decoder 600, a focus is on the most frequent cases in which the memory conflicts are caused by 2 or 3 memory accesses.

In most cases, there are less 3 concurrent memory accesses to the same memory bank, priority router 640 allows memory accesses to directly go through and write these data into buffer 645. In accordance with an embodiment, when there are more than 3 concurrent memory accesses in a memory conflict event (as indicated by conflict detection unit 655), priority router 640 chooses 3 of them and writes them into buffer 645. At the same time, conflict detection unit 655 sends HOLD signal to MAP decoders of the memory accesses that are not allowed. According to an alternative embodiment, priority router 640 sends HOLD signal to MAP decoders of the memory accesses that are not allowed.

As a example, when the MAP decoders receive the HOLD signal from conflict detection unit 655, they may stall (or halt) for one clock cycle. There are several different methods for priority router 640 to use to decide which data could be written into buffer 645 and which should be held. These methods (which are beyond the scope of the example embodiments and will not be discussed herein) are used to set different priorities for each possible memory access during a memory conflict so that each MAP decoder may be guarranteed a relatively fair chance to output their data. By doing so, it is possible to minimize the latency of the whole buffer system.

According to an embodiment, buffer control 650 may be used to manage the reading and the writing operations for buffer 645. For example, on every time step, buffer control 650 checks availability of empty slots inside buffer 645. Buffer control 650 tells priority router 640 the number of the available slots of buffer 645. Priority router 640 will determine how many new data can be received based on the number of available slots and decide which of the data produced by the MAP decoders can be written into buffer 645.

According to an example embodiment, there may be some design trade-offs for designing buffer system as shown. For instance, the depth of buffer 645 needs to be considered. In order to reduce the hardware resource cost, the depth of buffer 645 needs to be as short as possible without increasing the latency. However, when the depth of buffer 645 is reduced, then sometimes the number of empty slots in buffer 645 are not sufficient to hold the data in next clock cycle. Which may lead to stalling (or halting) some of the MAP decoders by asserting the HOLD signal. Assertion of the HOLD signal generally increase the latency. Therefore, buffer depth may need to be considered carefully.

According to an example embodiment, the number of simultaneous memory accesses supported by memory bank buffer control unit 635 may be a design choice made based on factors such as desired performance of turbo decoder 600, hardware and/or software costs, and the like. For example, two, three, four, or more simultaneous memory accesses may be supported by memory bank buffer control unit 635, however, with a greater number of simultaneous memory accesses supported, more complexity may be introduced to buffer control 650 and conflict detection unit 655. Additionally, buffer 645 may need to be larger.

Although shown as a circular buffer with depth D, buffer 645 may be implemented as any form or type of buffer. Therefore the discussion of a circular buffer should not be construed as being limiting to either the scope or spirit of the embodiments. Additionally, the size of buffer 645 may be dependent on a number of simultaneous memory accesses to i-th memory bank 630 to be supported. In general, the size of buffer 645 increases with increasing number of simultaneous memory accesses.

According to an example embodiment, several parameters may affect the latency of the router. Tables 2 through 5 illustrate performance of turbo decoder 600 with a variety of values for the key parameters. The parameters include:

Block size (K): the block size of one codeword;

P: the parallelism of the MAP decoding algorithm, this is measured by the number of concurrent LLR data output, for example, if all the MAP decoders produce 16 LLR values in one clock cycle, P is 16;

M: number of memory banks;

m: number of the output of priority router, this number show the maximum number of LLR data that are allowed to be written into the circular buffer at the same time;

D: the depth of circular buffer;

Number of stalled MAP decoders: this number shows how many MAP decoders have been stalled during the decoding process of one codeword;

Number of buffer almost full event: this shows how many times the buffer is almost full and cannot store new data at that time;

Ideal clock cycles (C0): this shows when assume there is no memory conflict, the number of clock cycles needed to write all the LLR data into the memory;

Actual clock cycles (C1): the actual number of clock cycles needed to store all the LLR data into the memory, including the latency of the buffer system; and Latency (C1-C0): the latency of the buffer system; if the buffer system is not used, the latency will be very a large number. The latency is a value that could possibly affect the system throughput. The goal of the buffer system is to minimize this number.

Table 2 shows that as the number of the priority router output is increased, the latency reduces at first. Nevertheless, when the number of MUXs is larger than 4, further increasing the number of priority router output does not help. This fact matches the results of memory access pattern shown previously.

TABLE 2

Performance of turbo decoder 600 for different number of MUXs.

| | Parameters | | | | Results | | | | |
|---|---|---|---|---|---|---|---|---|---|
| Block size | P | Number of Memory Banks (M) | Num of Priority Router output (m) | Buffer Depth | Number Of Stalled Producers | Buffer almost Full | Ideal clock cycles (C0) | Actual clock cycles (C1) | Latency (C1-C0) |
| 5114 | 16 | 16 | 1 | 15 | 2063 | 0 | 320 | 481 | 161 |
| 5114 | 16 | 16 | 2 | 15 | 157 | 0 | 320 | 341 | 21 |
| 5114 | 16 | 16 | 3 | 15 | 43 | 5 | 320 | 336 | 16 |
| 5114 | 16 | 16 | 4 | 15 | 28 | 11 | 320 | 335 | 15 |

Table 3 shows when the buffer size becomes larger than a specific value, further increasing the buffer size does not help reduce the latency, especially when the buffer is big enough so that the buffer is almost never full during the decoding process.

TABLE 3

Results for turbo decoder 600 for different buffer sizes.

| | Parameters | | | | Results | | | | |
|---|---|---|---|---|---|---|---|---|---|
| Block size | P | Number of Memory Banks (M) | Num of Priority Router output (N_select) | Buffer Depth | Number Of Stalled Producers | Buffer almost Full | Ideal clock cycles (C0) | Actual clock cycles (C1) | Latency (C1-C0) |
| 5114 | 16 | 16 | 3 | 5 | 454 | 325 | 320 | 366 | 46 |
| 5114 | 16 | 16 | 3 | 10 | 101 | 66 | 320 | 336 | 16 |
| 5114 | 16 | 16 | 3 | 15 | 43 | 5 | 320 | 336 | 16 |
| 5114 | 16 | 16 | 3 | 20 | 52 | 0 | 320 | 335 | 15 |

Table 4 shows that increasing the number of memory banks (M) helps to reduce the latency significantly. However, when M is bigger than 64, further increasing M typically does not further reduce latency significantly.

TABLE 4

Results for turbo decoder 600 for different number of memory banks.

| | Parameters | | | | Results | | | | |
|---|---|---|---|---|---|---|---|---|---|
| Block size | P | Number of Memory Banks (M) | Num of Priority Router output (N_select) | Buffer Depth | Number Of Stalled Producers | Buffer almost Full | Ideal clock cycles (C0) | Actual clock cycles (C1) | Latency (C1-C0) |
| 5114 | 16 | 16 | 4 | 20 | 13 | 0 | 320 | 335 | 15 |
| 5114 | 16 | 32 | 4 | 20 | 3 | 0 | 320 | 329 | 9 |
| 5114 | 16 | 64 | 4 | 20 | 3 | 0 | 320 | 324 | 4 |
| 5114 | 16 | 128 | 4 | 20 | 1 | 0 | 320 | 324 | 4 |

Table 5 shows the buffer-based architecture also works well for other block sizes. The latency values for different block sizes are very small so that they generally will not affect the system throughput.

TABLE 5

Results for turbo decoder 600 for different block sizes.

| | Parameters | | | | Results | | | | |
|---|---|---|---|---|---|---|---|---|---|
| Block size | P | Number of Memory Banks (M) | Num of Priority Router output (N_select) | Buffer Depth | Number Of Stalled Producers | Buffer almost Full | Ideal clock cycles (C0) | Actual clock cycles (C1) | Latency (C1-C0) |
| 1024 | 16 | 64 | 3 | 10 | 0 | 0 | 64 | 66 | 2 |
| 2048 | 16 | 64 | 3 | 10 | 0 | 0 | 128 | 129 | 1 |
| 3072 | 16 | 64 | 3 | 10 | 0 | 0 | 192 | 194 | 2 |
| 4096 | 16 | 64 | 3 | 10 | 0 | 0 | 256 | 258 | 2 |

The use of buffers, such as buffer 645, may allow for resolution of memory access conflicts and significantly reduce latency introduced by frequent memory access conflicts. However, when a buffer for a memory bank is empty, there is no need to write the data to the buffer. Instead, the data may be written directly to the memory bank.

Figure 7:
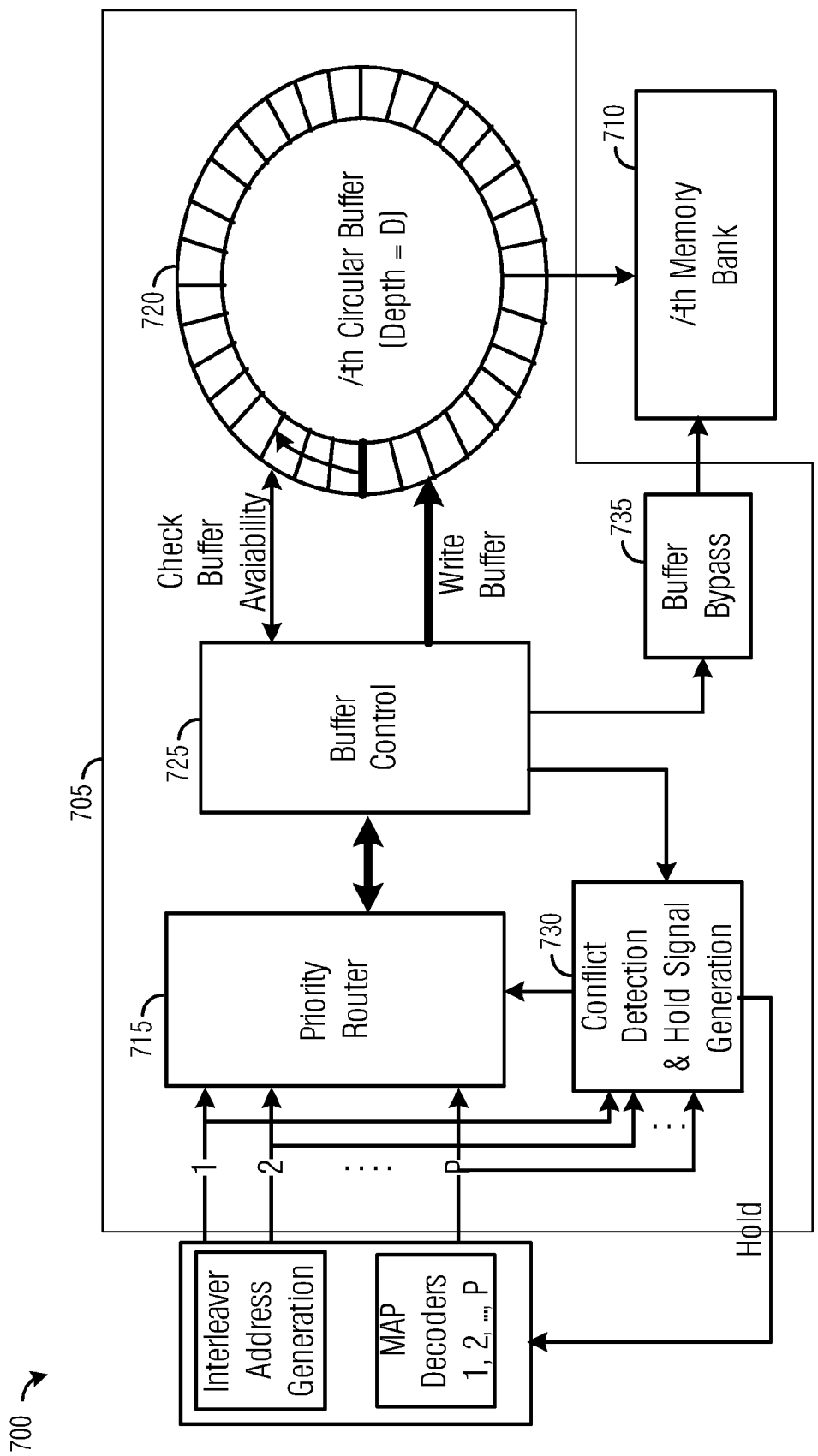
FIG. 7 illustrates an example diagram of a portion of a turbo decoder, wherein a buffer control unit with a buffer bypass is shown in detail according to example embodiments described herein.

FIG. 7 illustrates a portion of a turbo decoder 700 in an example embodiment, wherein a buffer control unit 705 with a buffer bypass 735 is shown in detail. As shown in FIG. 7, buffer control unit 705 may be coupled to an i-th memory bank 710 as well as MAP decoders and an interleaver address generation unit. Buffer control unit 705 includes a priority router 715, a buffer 720 (shown in FIG. 7 as a circular buffer, but other buffer types may be used), a buffer control 725, and a conflict detection unit 730. As an example embodiment, priority router 715, buffer 720, buffer control 725, and conflict detection unit 730 may be similar to corresponding circuitry in buffer control unit 635 of FIG. 6.

According to an embodiment, buffer control unit 705 also includes buffer bypass 735 coupled between buffer control 725 and i-th memory bank 710. Buffer bypass 735 may allow buffer control 725 to write the data directly to i-th memory bank 710 when buffer 720 is in an empty state, rather than writing the data to buffer 720 and then writing contents of buffer 720 to i-th memory bank 710.

The use of buffer bypass 735 allows the direct writing of the data to i-th memory bank 710 instead of writing the data to buffer 720 and then in a subsequent memory cycle, writing the data from buffer 720 to i-th memory bank 710. A memory cycle may be saved by using buffer bypass 735. Table 6 displays an impact of buffer bypass on overall turbo decoder 700 performance. Table 6 shows that the use of a buffer bypass significantly reduces latency and further allows for a reduction in buffer size without negatively impacting performance.

MAP decoder, a stalling, holding, or halting technique may not be adequate in providing good results. The use of a Radix-4 PDFN MAP decoder is for illustrative purposes only, the embodiments are not limited to Radix-4 PDFN MAP decoders. The embodiments may be operable with any high radix MAP decoders and any parallel turbo decoder with different parallelisms. Therefore, the discussion of a Radix-4 PDFN MAP decoder should not be construed as being limiting to either the scope or the spirit of the embodiments.

Figure 8A:
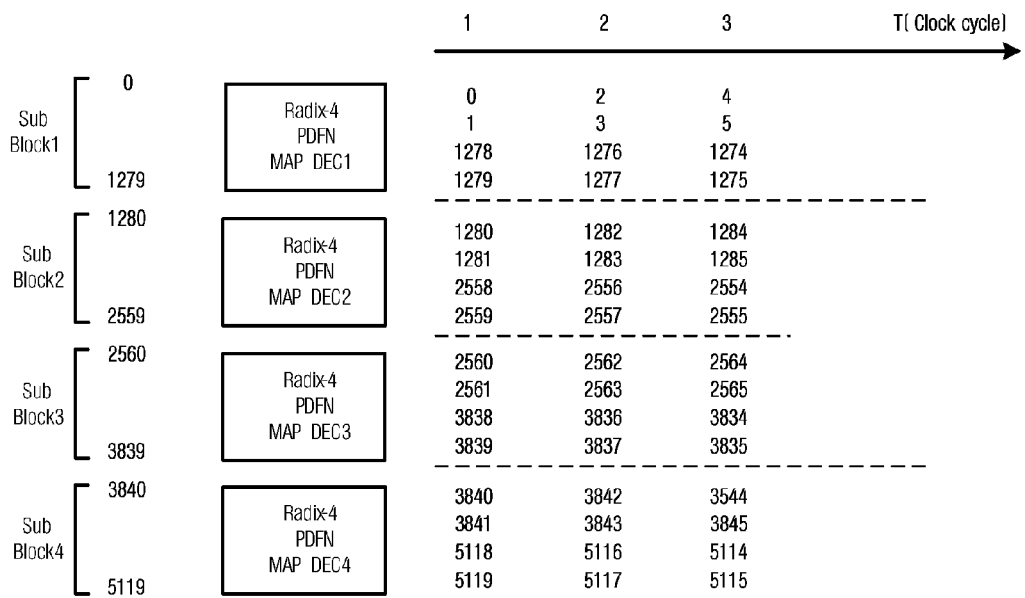
FIGS. 8a and 8b illustrate example diagrams of data production by a Radix-4 PDFN MAP decoder according to example embodiments described herein.
Figure 8B:
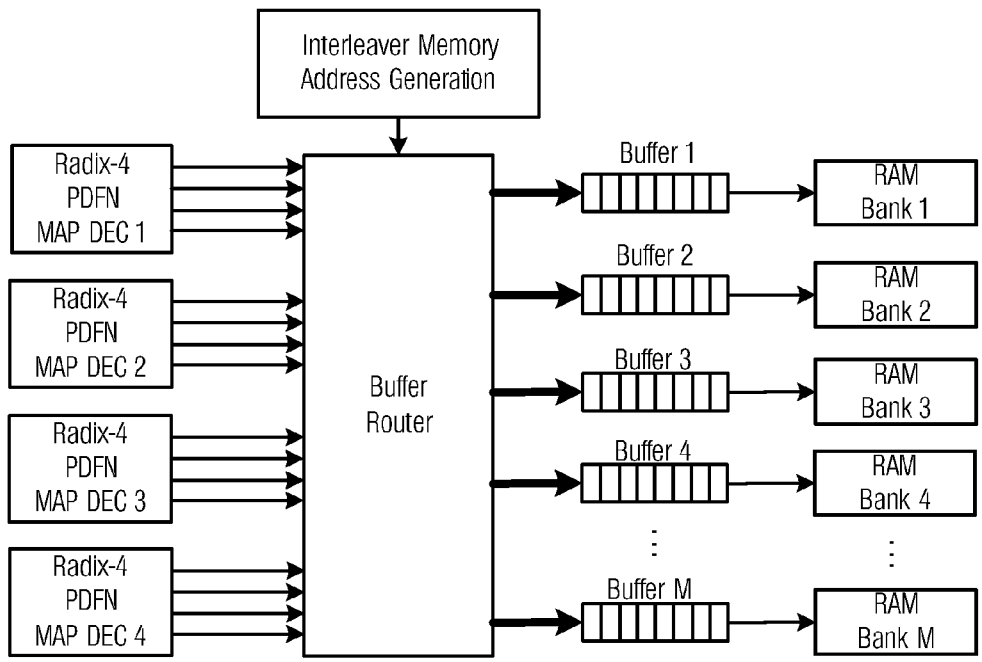

FIGS. 8a and 8b illustrate data production by a Radix-4 PDFN MAP decoder. As shown in FIG. 8a, the Radix-4 PDFN MAP decoder produces four data units per clock cycle. Therefore, if a buffering technique like those described previously with the ability to resolve three simultaneous memory accesses is used, then the Radix-4 PDFN MAP decoder is stalled, held, or halted each time it produces four data units although only one of the four data units actually causes a memory conflict. The repeated stalling of the Radix-4 PDFN MAP decoder will result in significantly increased latency.

Figure 9:
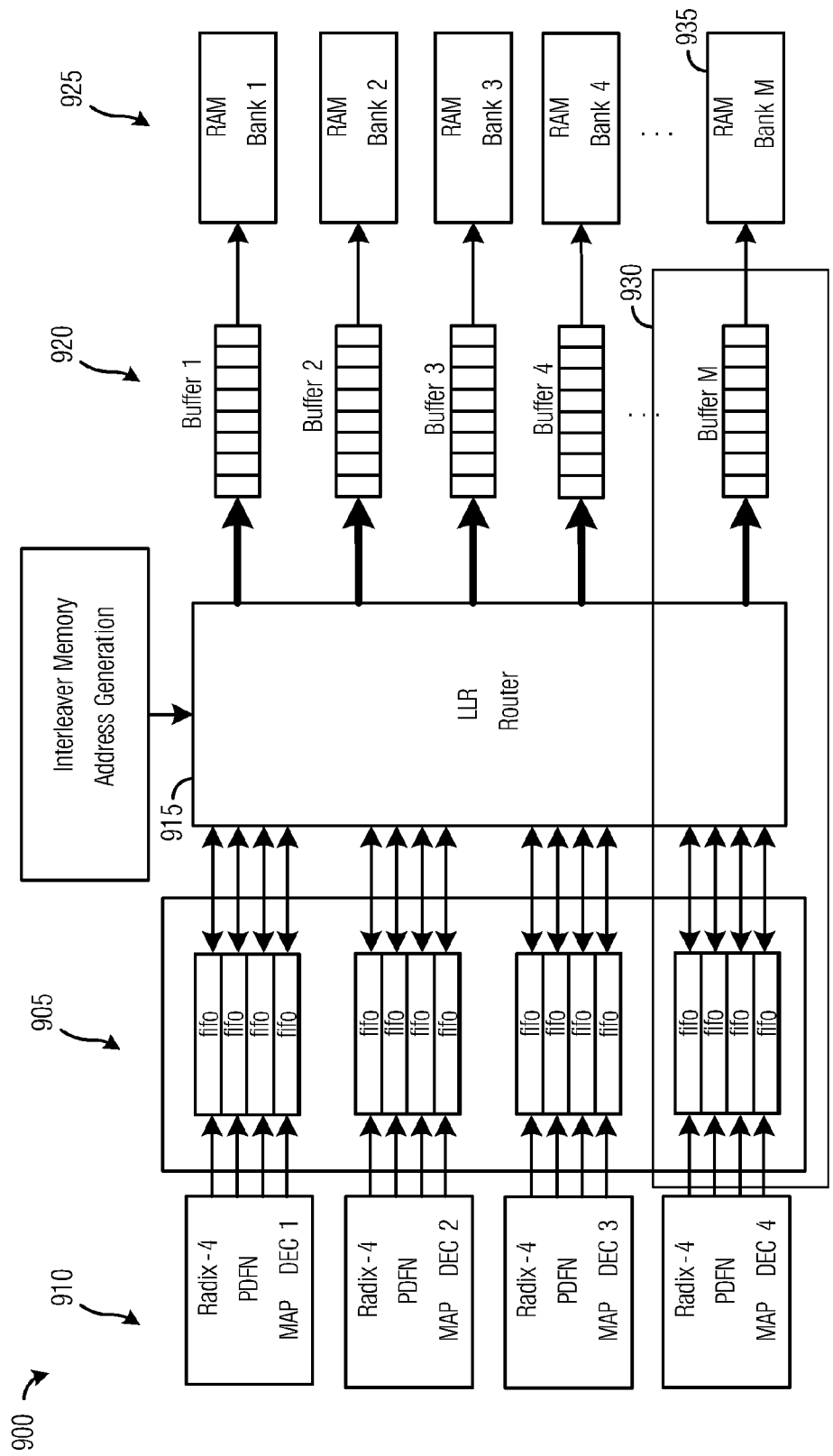
FIG. 9 illustrates an example diagram of a turbo decoder, wherein the turbo decoder includes double buffering to reduce memory access conflicts according to example embodiments described herein.

FIG. 9 illustrates a turbo decoder 900, wherein turbo decoder 900 includes double buffering to reduce memory access conflicts. Turbo decoder 900 includes a first buffer 905 between a plurality of MAP decoders 910 and router 915 as well as a second buffer 920 between router 915 and memory 925. First buffer 905 may comprise a plurality of buffers (e.g., first in first out buffers) with each buffer coupled to an output of a MAP decoder. According to an example embodiment, if a MAP decoder produces more than one data output per clock cycle, a sufficient number of buffers may be available to buffer the outputs of the MAP decoder. The MAP decoders in plurality of MAP decoders 910 may directly write their data into first buffer 905 and router 915 will interact with first buffer 905 instead of plurality of MAP decoders 910. A buffer control unit 930 connects plurality of MAP decoders 910 to M-th memory bank 935.

TABLE 1

Results for bypass mode.

| | Parameters | | | | | Results | | | | |
|---|---|---|---|---|---|---|---|---|---|---|
| Architecture | Block size | P | Number of Memory Banks (M) | Num of Priority Router output (N_select) | Buffer Depth | Number Of Stalled Producers | Buffer almost Full | Ideal clock cycles (C0) | Actual clock cycles (C1) | Latency (C1-C0) |
| No bypass | 5114 | 16 | 64 | 3 | 7 | 10 | 3 | 320 | 324 | 4 |
| Bypass | 5114 | 16 | 64 | 3 | 7 | 10 | 0 | 320 | 322 | 2 |
| Bypass | 5114 | 16 | 64 | 3 | 3 | 10 | 7 | 320 | 322 | 2 |

Figure 10:
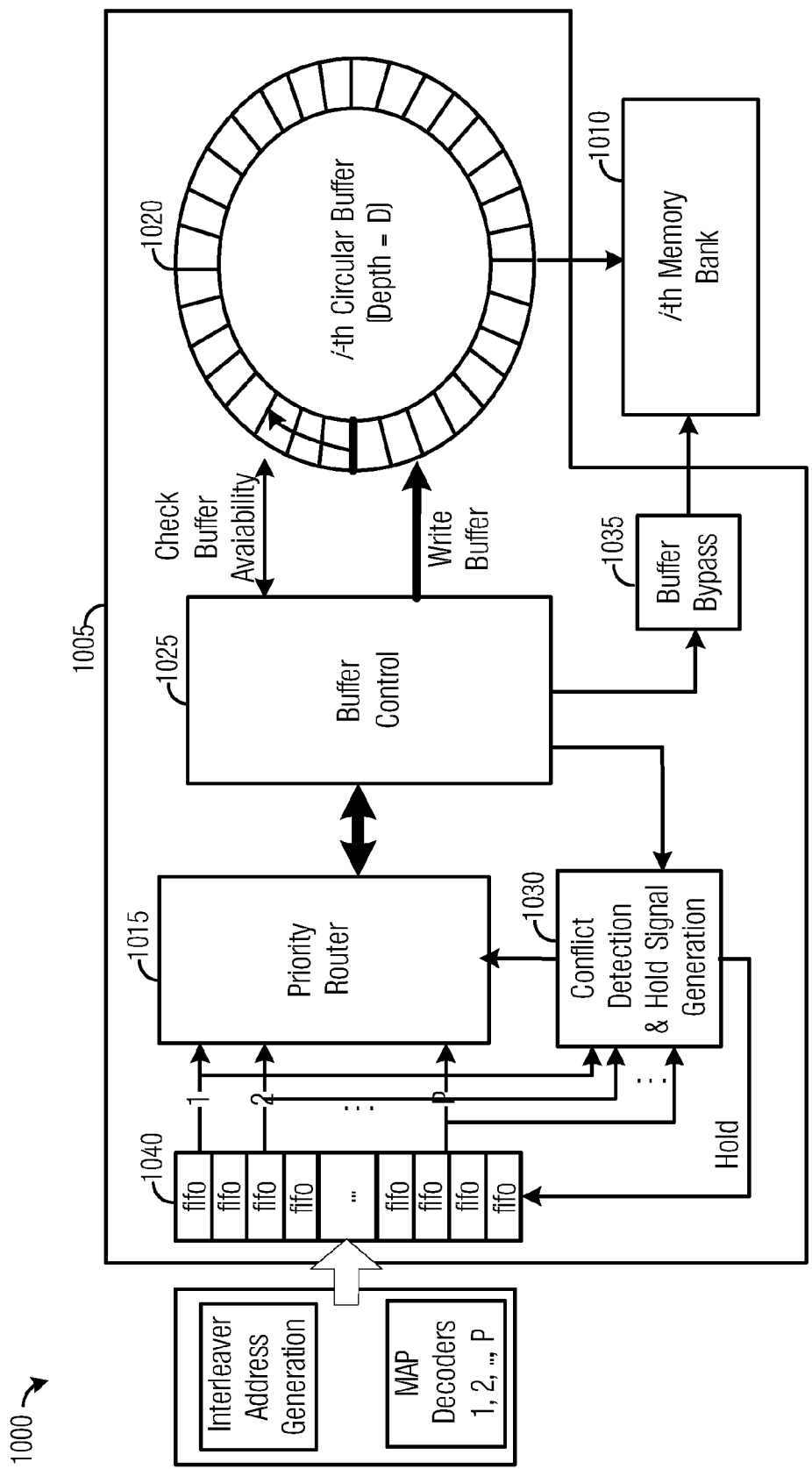
FIG. 10 illustrates an example diagram of a detailed view of a buffer control unit according to example embodiments described herein.

The example embodiments described heretofore have focused on Radix-2 single flow MAP decoders. However, for higher radix MAP decoders, for example, a Radix-4 PDFN FIG. 10 illustrates a detailed view 1000 of a buffer control unit 1005. FIG. 10 provides a detailed view of buffer control unit 1005 that couples i-th memory bank 1010 to a plurality of MAP decoders and an interleaver address generation unit. Buffer control unit 1005 may be similar to buffer control unit 930 shown in FIG. 9.

In an embodiment, buffer control unit 1005 includes a priority router 1015, a first buffer 1020 (shown in FIG. 10 as a circular buffer, but other buffer types may be used), a buffer control 1025, a conflict detection unit 1030, and buffer bypass 1035. As an example, priority router 1015, first buffer 1020, buffer control 1025, conflict detection unit 1030, and buffer bypass 1035 may be similar to corresponding circuitry in buffer control unit 705 of FIG. 7.

According to an embodiment, buffer control unit 1005 also includes second buffer 1040 coupled between the plurality of MAP decoders and priority router 1015. Second buffer 1040 may be similar to first buffer 905 of FIG. 9. Priority router 1015 may interact with second buffer 1040 rather than the plurality of MAP decoders. At each clock cycle, each non-empty buffer in second buffer 1040 attempts to output one datum, and the priority router 1015 checks the memory access pattern of the outputs of second buffer 1040. When necessary, conflict detection unit 1030 may assert a hold signal to second buffer 1040 and a buffer corresponding to a MAP decoder that is causing memory access conflict(s) will hold outputting data and try to output data again in a subsequent clock cycle. According to an alternative example embodiment, conflict detection unit 1030 may assert a hold signal to priority router 1015 to hold its routing of data.

A high radix MAP decoder, such as a Radix-4 PDFN MAP decoder, along with the buffers in second buffer 1040 may be regarded as several independent regular single flow MAP decoders. The buffers in second buffer 1040 make the outputs of the MAP decoders independent again so that priority router 1015 can hold, stall, or halt them independently. Example embodiments of the double-buffer architecture have several advantages:

Do not need to stall or halt MAP decoder. Instead, the data in buffer is held when necessary. Therefore, the MAP decoder architecture for UMTS can be the same as that of LTE/WiMAX standard. Consistent MAP decoder architecture will reduce the complexity of the MAP decoder and will make the multi-mode decoder design easier; and Memory access is made smoother so it is possible to further reduce the buffer depth.

Tables 7 through 10 show results of comparisons between the single buffer architecture (e.g., FIG. 7) and the double buffer architecture (e.g., FIG. 10). Table 7 shows the results for both architectures without a buffer bypass mechanism. The double buffer architecture further reduces the minimum buffer depth required to achieve low latency, as shown in the 2nd and 3rd rows of Table 7. In addition, Table 8 shows the simulation results for both architectures with a buffer bypass mechanism.

With the double buffer architecture, since the MAP decoders are not stalled and the buffers further smooth the memory access flow, the buffer depth can be further (with or without buffer bypass) reduced without increasing the latency. In addition, the buffer size is only 3, so adding FIFOs into the buffer system will not significantly increase hardware cost.

Note that Parallelism P means the number of the PDFN MAP decoders. Each PDFN MAP decoder produces 4 LLR data in one clock cycle. Therefore, the parallelism of the concurrent LLR data outputs is equivalent to 4×P.

TABLE 7

Results of comparison between single buffer architecture and double buffer architecture, without bypass mechanism.

| Parameters | | | | | | Results | | | | |
|---|---|---|---|---|---|---|---|---|---|---|
| | | | | | | | | Ideal | Actual | |
| Architecture | Block size | P | Number of Memory Banks | N_select | FIFO Depth | Buffer Depth | Number Of Stalled Producers | Buffer almost Overflow | clock cycles (C0) | clock cycles (C1) | Latency (C1-C0) |
| Original | 5120 | 4 | 64 | 3 | — | 7 | 35 | 5 | 320 | 328 | 8 |
| Double-buffer | 5120 | 4 | 64 | 3 | 3 | 7 | 9 | 0 | 320 | 323 | 3 |
| Double-buffer | 5120 | 4 | 64 | 3 | 3 | 5 | 10 | 5 | 320 | 323 | 3 |

TABLE 8

Results of comparison between single buffer architecture and double buffer architecture, with bypass mechanism, K = 5120, P = 4

| Parameters | | | | | | Results | | | | |
|---|---|---|---|---|---|---|---|---|---|---|
| | | | | | | | | Ideal | Actual | |
| Architecture | Block size | P | Number of Memory Banks | N_select | FIFO Depth | Buffer Depth | Number Of Stalled Producers | Buffer almost Overflow | clock cycles (C0) | clock cycles (C1) | Latency (C1-C0) |
| Original | 5120 | 4 | 64 | 3 | — | 3 | 31 | 26 | 320 | 324 | 4 |
| Double-buffer | 5120 | 4 | 64 | 3 | 3 | 3 | 9 | 0 | 320 | 322 | 2 |
| Double-buffer | 5120 | 4 | 64 | 3 | 3 | 2 | 9 | 9 | 320 | 322 | 2 |

Table 9 shows the memory comparison between the single buffer and the double buffer architectures. The comparison indicates that the double buffer architecture could achieve the same latency performance with less memory.

TABLE 9

Memory Requirement comparison between single buffer and double buffer architectures.

| | Buffer Depth | Number of Buffer | Total Buffer Size | FIFO Depth | Number of FIFO | Total FIFO Size | Total Memory Location |
|---|---|---|---|---|---|---|---|
| Original Architecture | 3 | 64 | 192 | 0 | 16 | 0 | 192 |
| Double-buffer Architecture | 2 | 64 | 128 | 3 | 16 | 48 | 176 |
| Difference | — | — | −64 | — | — | 48 | −16 |

Table 10 shows the results for different block sizes. The results show that the double buffer architecture works well for different block sizes.

TABLE 10

Results for double buffer architecture with different block sizes.

| Parameters | | | | | | | Results | | |
|---|---|---|---|---|---|---|---|---|---|
| Block size | P | Number of Memory Banks | N_select | FIFO Depth | Buffer Depth | Number Of Stalled FIFOs | Buffer almost Overflow | Ideal clock cycles (C0) | Actual clock cycles (C1) | Latency (C1-C0) |
| 1200 | 4 | 64 | 3 | 3 | 2 | 5 | 5 | 75 | 77 | 2 |
| 2400 | 4 | 64 | 3 | 1 | 2 | 0 | 0 | 150 | 150 | 0 |
| 3600 | 4 | 64 | 3 | 3 | 2 | 9 | 9 | 225 | 227 | 2 |
| 5114 | 4 | 64 | 3 | 3 | 2 | 9 | 9 | 320 | 322 | 2 |

From the results shown in Table 10, it is known that for block size K=5114, parallelism P=16, up to 3 data at a time chosen by the priority router, FIFO depth 3, and with the buffer depth D=3, the latency for the double buffer architecture is 2 clock cycles. It is noted that the latency of the control logic in the buffer router is counted as one clock cycle.

From the analysis shown above and implementation results, it may be possible to conclude that the double buffer architecture UMTS interleaver could significantly reduce the latency caused by memory access conflicts. Especially, after adding the buffer bypass, the latency can be further reduced without significantly increasing hardware cost. As shown above, a turbo decoder utilizing the double buffer architecture presented herein achieves performance that closely approximates the decoding throughput of a model turbo decoder with an ideal interleaver that does not have memory conflicts.

The above discussion focuses on writes from MAP decoders to memory. In the first half iteration, read memory accesses are performed sequentially. Each MAP decoder only read the data from a corresponding memory bank. In the second half iteration, the data should be read from the memory in an interleaved way which may cause memory conflict problem. However, memory read conflicts may be handled by writing the data in an interleaved way in both of the half iterations. Since the memory read addresses pattern in each iteration is known, it is possible to write the data according to the interleaving algorithm so that when reading the data from the memory it is possible to read the data sequentially in order. For example, MAP decoder i may only read from memory bank i. Therefore, conflicts in read memory accesses may be avoided by reading sequentially from the MAP decoder's own memory bank and writing the data based on the interleaving algorithm.

Figure 11:
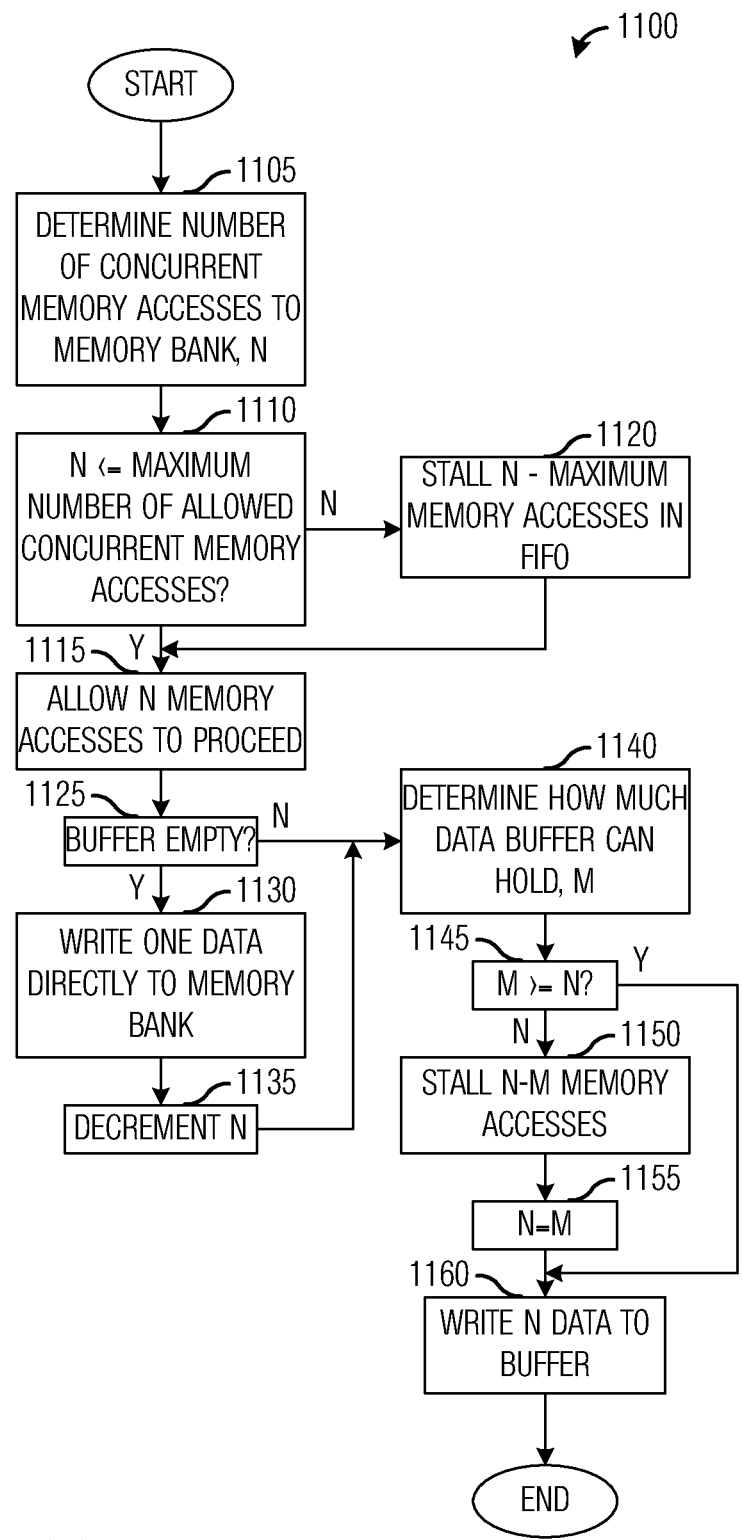
FIG. 11 illustrates an example flow diagram of operations occurring in a buffer control unit as the buffer control unit provides read and write access to a memory bank according to example embodiments described herein.

FIG. 11 illustrates a flow diagram of operations 1100 occurring in a buffer control unit as the buffer control unit provides read and write access to a memory bank. Operations 1100 may be indicative of operations occurring in a buffer control unit, such as buffer control unit 705 or buffer control unit 1005, as the buffer control unit provides memory access to MAP decoders coupled to the buffer control unit. Operations 1100 may occur while the buffer control unit is in a normal operating mode.

Operations 1100 may begin with the buffer control unit determining a number of concurrent memory accesses to a memory bank that it is controlling (N) (block 1105). According to an embodiment, a priority router may be able to determine from memory addresses if a memory access is to a memory location within its memory bank. The buffer control unit may then compare the number of concurrent memory accesses (N) to a maximum number of concurrent memory accesses allowed (block 1110).

If the number of concurrent memory accesses (N) is less than or equal to the maximum number of concurrent memory accesses (K) (block 1110), then the buffer control unit may permit all N concurrent memory accesses to proceed (block 1115). However, if the number of concurrent memory accesses (N) is greater than the maximum number of concurrent memory accesses (block 1110), then the buffer control unit may stall the number of concurrent memory accesses that are greater than the maximum number of concurrent memory accesses (i.e., N−maximum number of concurrent memory accesses, or simply N−K) in the FIFO (e.g., second buffer 1040 of FIG. 10) (block 1120).

According to an embodiment, the buffer control unit may stall the concurrent memory accesses by either asserting a hold signal on MAP decoders that generated the memory accesses to be stalled (useful in the single buffer architecture)

or buffers of MAP decoders that generated the memory accesses to be stalled (useful in the dual buffer architecture).

For the N concurrent memory accesses that are allowed to proceed, the buffer control unit may perform a check to determine if a buffer associated with the memory bank is empty (block 1125). If the buffer is empty, then the buffer control unit may directly perform one of the memory accesses (for example, a memory write) directly to the memory bank instead of writing data associated with the memory write to the buffer (block 1130). The buffer control unit may then decrement N (block 1135). It is noted that if the memory bank is a multiple write port memory bank, e.g., an L port memory bank, then the buffer control unit may perform up to L of the N memory accesses (e.g., memory writes) to the memory bank.

If the buffer is not empty or if the buffer control unit has performed one of the memory accesses, the buffer control unit may then perform a check to determine how much data the buffer is capable of holding, M (block 1140). According to an embodiment, the buffer control unit determines an amount of free space in the buffer.

The buffer control unit may then perform a check to determine if the amount of data that the buffer is capable of holding (M) is greater than or equal to the number of concurrent memory accesses (N) (block 1145). If M is less than N, then the buffer control unit must stall a number of concurrent memory accesses that cannot be stored in the buffer (N−M) (block 1150).

According to an embodiment, the buffer control unit may stall the concurrent memory accesses by either asserting a hold signal on MAP decoders that generated the memory accesses to be stalled (useful in the single buffer architecture) or buffers of MAP decoders that generated the memory accesses to be stalled (useful in the dual buffer architecture).

If M is greater than or equal to N, then the buffer control unit may set N equal to M (block 1155) and store data associated with the N concurrent memory accesses to the buffer (block 1160). Operations 1100 may then terminate.

Although the present invention and its advantages have been described in detail, it should be understood that various changes, substitutions and alterations can be made herein without departing from the spirit and scope of the invention as defined by the appended claims.

What is claimed is:

1. A memory control unit of a turbo code decoder comprising:
    a first buffer having a plurality of storage slots, wherein the first buffer is configured to temporarily store data intended for storage in a memory bank;
    a buffer control operatively coupled to the first buffer, wherein the buffer control is configured to determine a number of available storage slots in the first buffer;
    a second buffer operatively coupled to a plurality of data sources, wherein the second buffer is configured to temporarily store data received from the data sources attempting to access the memory bank;
    a router operatively coupled to the buffer control and to the second buffer, wherein the router is configured to route data from the second buffer to the buffer control; and
    a conflict detection unit operatively coupled to the router, to the buffer control, and to the second buffer, wherein the conflict detection unit is configured to initiate a temporary halt of the second buffer when the data received from the data sources causes multiple concurrent accesses to the memory bank.

2. The memory control unit of claim 1, wherein the conflict detection unit is configured to temporarily halt operation of an integer N of concurrent accesses to the memory bank, wherein N is equal to a number of data sources attempting to concurrently access the memory bank minus an integer K, and wherein K is equal to a maximum number of concurrent memory accesses allowed.

3. The memory control unit of claim 2, wherein the router is further configured to determine the N attempts to concurrently access the memory bank by the data sources, and wherein data from K of the data sources are forwarded to the buffer control.

4. The memory control unit of claim 1 further comprising a bypass unit operatively coupled to the buffer control and to the memory bank, wherein the bypass unit is configured to route data from the buffer control unit to the memory bank when the first buffer is empty, and wherein the routed data is not sent to the first buffer prior to the memory bank receiving the routed data.

5. The memory control unit of claim 1, wherein the memory control unit operates in synchrony with a sequence of clock cycles, wherein in each clock cycle of the sequence of clock cycles, the buffer control is configured to write data stored in up to L storage slots of the first buffer to the memory bank, wherein L is a number of write ports of the memory bank, and wherein the router is further configured to route data from the second buffer to the buffer control based on priority.

6. The memory control unit of claim 1, wherein the second buffer comprises a plurality of buffer units, and wherein the conflict detection unit is configured to assert a specified value on a control signal to initiate the temporary halt for some of the buffer units.

7. The memory control unit of claim 1, wherein the second buffer is configured to forward data from up to K of the data sources attempting to concurrently access the memory bank to the router, and wherein K is a maximum number of concurrent allowable memory accesses.

8. The memory control unit of claim 7, wherein the second buffer is configured to stall sending some of the data from the data sources attempting to access the memory bank to the router when the number of data sources attempting to concurrently access the memory bank exceeds K.

9. The memory control unit of claim 1, wherein the second buffer comprises a plurality of first in first out (FIFO) buffers, wherein each of the FIFO buffers are operatively coupled to a port located at one of the data sources, and wherein the first buffer is accessed in a circular order.

10. The memory control unit of claim 1, wherein the conflict detection unit is not configured to send a hold signal directly to the data source units, and wherein each of the data sources are configured to implement a parallel maximum a posteriori probability (MAP) decoding algorithm, and wherein each of the data sources comprise two or more outputs that are operatively coupled to the memory control unit.

11. An information decoder comprising:
    decoders configured to collectively decode a signal according to a decoding algorithm, and to generate data therefrom;
    an address generator configured to generate memory addresses for the data generated by the decoders;
    a plurality of memory banks configured to store the data generated by the decoders according to the memory addresses generated by the address generator; and
    a plurality of memory control units,
    wherein each of the memory control units are operatively coupled to the decoders, to one of the memory banks, and to the address generator, wherein each of the memory control units having a plurality of storage slots configured to temporarily store data intended for storage in the one of the memory banks, and wherein each of the memory control units are configured to:
- receive data from the decoders;
- determine a number of concurrent memory accesses to the one of the memory banks attempted by the decoders;
- determine a maximum number of concurrent allowable memory accesses to the one of the memory banks; and
- stall a number of memory accesses that exceed the maximum number of concurrent allowable memory accesses for the one of the memory banks, and wherein each of the decoders continue to transmit the generated data to the memory control units when the memory control units stall the number of memory accesses to the one of the memory banks.

12. The information decoder of claim 11, wherein each of the decoders is a soft-in soft-out decoder, wherein each of the memory control units are further configured to:
- determine a number of available storage slots;
- route data from the decoders to the storage slots; and
- temporarily stall storing data within the storage slots when the number of available storage slots is insufficient to store all of the data from the decoders attempting to access the one of the memory banks, and wherein the storage slots are operatively arranged in a circular shape.

13. The information decoder of claim 12, wherein each of the decoders implements a maximum a posteriori probability (MAP) algorithm to decode the signal, and wherein the MAP algorithm is implemented as a Radix decoding architecture of at least Radix-2.

14. The information decoder of claim 12, wherein the signal is a turbo code encoded signal, and wherein each of the memory control units are further configured to bypass temporarily storing data within the storage slots by directly storing the data within the one of the memory banks when the storage slots do not store any data.

15. The information decoder of claim 11, wherein each of the memory control units is configured to buffer the generated data received from the decoders attempting to access the one of the memory banks and route the generated data received from the decoders based on priority.

16. The information decoder of claim 15, wherein each of the memory control units is further configured to forward data from up to K of the decoders attempting to access the one of the memory banks to a router, wherein K is a maximum number of concurrent allowable memory accesses in a single memory control unit, and wherein a total number of memory banks within the information decoder exceeds a total number of decoders within the information decoder.

17. The information decoder of claim 16, wherein each of the memory control units is configured to stall data from the decoders within a buffer when a number of the decoders attempting to access the one of the memory banks exceeds K.

18. A method for operating a memory control unit, wherein the method comprises:
- receiving, from a data source, data associated with an integer number N concurrent memory accesses to a memory bank;
- buffering the received data at a first buffer;
- determining an integer number K that represents a maximum number of concurrent memory accesses to the memory bank;
- determining an integer number M of available storage slots in a second buffer;
- temporarily storing the data associated with the N concurrent memory accesses to the second buffer if M is greater than or equal to N;
- temporarily storing the data associated with M of the N concurrent memory accesses to the second buffer if N is greater than M;
- halting the temporary storing of data at the second buffer for the N−M of the N concurrent memory access if N is greater than M; and
- halting N−K of the N concurrent memory access at the first buffer if N is greater than K.

19. The method of claim 18, wherein the method further comprises writing data associated with up to L of the N concurrent memory accesses when the second buffer is temporarily storing at least one piece of data, wherein L is a number of write ports of the memory bank, and wherein the second buffer is accessed in a circular way.

20. The method of claim 18, wherein the memory control unit operates in synchrony with a sequence of clock cycles, and wherein halting at the first buffer comprises asserting a specified value on a control signal that holds the data for at least one clock cycle at the first buffer.

21. The method of claim 20, wherein the first buffer continues to receive data from the data source when halting N−K of the N concurrent memory access at the first buffer, and wherein selecting data from K of the data sources to route to the second buffer is based on priority.

22. The method of claim 18, wherein the received data is directly written into the memory bank without being first stored in the second buffer when the second buffer is empty.

* * * * *

UNITED STATES PATENT AND TRADEMARK OFFICE
CERTIFICATE OF CORRECTION

| | | |
|---|---|---|
| PATENT NO. | : 8,621,160 B2 | Page 1 of 1 |
| APPLICATION NO. | : 13/329065 | |
| DATED | : December 31, 2013 | |
| INVENTOR(S) | : Guohui Wang et al. | |

It is certified that error appears in the above-identified patent and that said Letters Patent is hereby corrected as shown below:

Title Page 2, under Item (56), References Cited, under Other Publications, the following cited art should read:

"Thul, M.J., et al., "Optimized Concurrent Interleaving Architecture for High-Throughput Turbo-Decoding", IEEE International Conference on Electronics, Circuits and Systems (2002); pp. 1099-1102."

In the Claims:

Column 18 Line 9 should read: "wherein data from K of the data sources is forwarded to the"

Column 18 Line 50 should read: "directly to the data source units, wherein each of the data"

Column 20 Line 43 should read: "of the N concurrent memory accesses at the first buffer, and"

Signed and Sealed this
Twenty-fifth Day of February, 2014

Michelle K. Lee
*Deputy Director of the United States Patent and Trademark Office*